United States Patent [19]

Nonaka et al.

[11] Patent Number: 5,287,019
[45] Date of Patent: Feb. 15, 1994

[54] ECL TO CMOS LEVEL CONVERSION CIRCUIT

[75] Inventors: Kazuyuki Nonaka; Shinji Saito; Tetsuya Aisaka; Takehiro Akiyama; Kouzi Takekawa, all of Kasugai, Japan

[73] Assignees: Fujitsu Limited, Kanagawa; Fujitsu VLSI Limited, Aichi, both of Japan

[21] Appl. No.: 788,369

[22] Filed: Nov. 6, 1991

[30] Foreign Application Priority Data

Nov. 6, 1990 [JP] Japan .................. 2-300701

[51] Int. Cl.$^5$ ............... H03K 19/092; H03K 3/01
[52] U.S. Cl. .................. 307/475; 307/446; 307/451; 307/455; 307/296.3
[58] Field of Search ........... 307/475, 451, 455, 446, 307/296.3

[56] References Cited

U.S. PATENT DOCUMENTS

| | | | |
|---|---|---|---|
| 4,713,560 | 12/1987 | Herndon | 307/296.3 |
| 4,883,988 | 11/1989 | Ide et al. | 307/443 |
| 4,958,094 | 9/1990 | Ishii et al. | 307/296.3 |
| 4,992,681 | 2/1991 | Urakawa et al. | 307/475 |
| 5,138,199 | 8/1992 | Hirata et al. | 307/451 |

FOREIGN PATENT DOCUMENTS 0249541 12/1987 European Pat. Off. .
0333864 9/1989 European Pat. Off. .
63-126316 5/1988 Japan .

Primary Examiner—Edward P. Westin
Assistant Examiner—Richard Roseen
Attorney, Agent, or Firm—Staas & Halsey

[57] ABSTRACT

A level conversion circuit includes an ECL logic circuit including a current switch circuit having first and second transistors, each of the transistors having an emitter coupled to each other and at least one thereof receiving an input signal of ECL logic level, and an output transistor coupled to a collector of at least one of the first and second transistors; a current control circuit including a current mirror circuit having third and fourth transistors, at least one of the transistors being coupled to an output end of the output transistor, and controlling a current flowing through the output to thereby carry out a level conversion of a signal at the output end; and a switch circuit operative coupled to the current control circuit. The switch circuit responds to a control signal and thus controls a supply of a current or a break thereof from the output transistor to the current control circuit. As a result, it is possible to decrease power dissipation in the present level conversion circuit without spoiling high speed operation thereof in a stand-by state of an apparatus or system to which it is applied.

28 Claims, 5 Drawing Sheets

ECL TO CMOS LEVEL CONVERSION CIRCUIT

BACKGROUND OF THE INVENTION

1. Field of the Invention

The present invention relates to a level conversion circuit, more particularly, to a circuit for converting an emitter-coupled logic (ECL) logic level into a complementary metal oxide semiconductor (CMOS) logic level.

Bipolar CMOS (Bi-CMOS) semiconductor integrated circuit devices are excellent in high speed operation and low power dissipation applications. Nevertheless, a further decrease in power dissipation has been recently demanded in Bi-CMOS. Accordingly, a further decrease in power dissipation of a level conversion circuit, which is employed in a Bi-CMOS semiconductor integrated circuit device to convert an ECL logic level into a CMOS logic level, has also been demanded.

2. Description of the Related Art

A known level conversion circuit of the above type generally comprises an ECL logic circuit having a pair of emitter-coupled transistors (current switch circuit) responsive to an input signal of ECL logic level, an output transistor coupled to a collector of at least one of the emitter-coupled transistors, and a current control circuit comprising a current mirror circuit for controlling a current flowing through the output of the output transistor, the circuit carrying out a level conversion of the input signal to a CMOS level control signal.

Since the level conversion circuit of this type employs a current mode logic in both the ECL logic circuit and the current control circuit, it can achieve high speed operation. However, some current always flows in both of the circuits and thus the power dissipation is relatively high.

Especially, when the level conversion circuit is used in an apparatus or system having a relatively long stand-by time during which it resides in an inoperative state, the power dissipation thereof is even greater. Accordingly, there is an even greater need to decrease the power dissipation of the entire circuit.

To this end, an idea that power supply voltages fed to the apparatus or system are cut off in the stand-by state has been conceived. However, when the apparatus or system is brought to its working state from its stand-by state and thus powered ON, a problem occurs in that the operations of each circuit supplied with the power supply voltages are delayed. This is an obstacle to high speed operation and thus is not desired.

The problems in the prior art will be explained in detail later in contrast with the preferred embodiments of the present invention.

SUMMARY OF THE INVENTION

An object of the present invention is to provide a level conversion circuit which can decrease power dissipation therein, without hindering high speed operation thereof, in a stand-by state of an apparatus or system in which it is applied.

According to a fundamental aspect of the present invention, there is provided a level conversion circuit comprising an ECL logic circuit having a current switch circuit of first and second transistors, each of the transistors having an emitter coupled to each other and at least one thereof receiving an input signal of ECL logic level, and an output transistor coupled to a collector of at least one of the first and second transistors; a current control circuit comprising a current mirror circuit, having third and fourth transistors, at least one of the transistors being coupled to output of the output transistor, and controlling a current flowing through the output of the output transistor to carry out a level conversion of the output signal in producing a signal at the output of the output transistor, the level converted output signal functioning as a CMOS level control signal; and a switch circuit, being operatively coupled to the current control circuit being responsive to a control signal and controlling a supply of a current or a break thereof from the output transistor to the current control circuit.

In one preferred embodiment of the present invention, the level conversion circuit comprises a first potential power supply line; a second potential power supply line; an ECL logic circuit having a current switch circuit of first and second transistors, each of the transistors being operatively coupled to the first potential power supply line, having an emitter coupled to each other and receiving an input signal of ECL logic level, a constant current source coupled between the first and second transistors and the second potential power supply line, and first and second output transistors each coupled to the first potential power supply line and responsive to a signal from a corresponding collector of the first and second transistors, respectively; a current control circuit comprising a current mirror circuit having third and fourth transistors each coupled between the second potential power supply line and a corresponding output of the first and second output transistors, respectively, and controlling a current flowing through one of the outputs to carry out a level conversion of the input signal in producing a signal at the one output the level converted output signal functioning as a CMOS level control signal; an output stage circuit, operatively coupled between the first and second potential power supply lines, responsive to a level converted signal from the current control circuit and forming an output signal of CMOS logic level; and a switch circuit, operatively coupled between the ECL logic circuit and the current control circuit, responsive to a control signal and controlling a supply of a current or a break thereof from the first and second output transistors to the third and fourth transistors, respectively.

Also, in a second preferred embodiment of the present invention, the level conversion circuit comprises a first potential power supply line; a second potential power supply line; an ECL logic circuit having a current switch circuit of first and second transistors, each of the transistors being operatively coupled to the first potential power supply line, having an emitter coupled to each other and receiving an input signal of ECL logic level, a constant current source coupled between the first and second transistors and the second potential power supply line, and an output transistor coupled to the first potential power supply line and responsive to a signal from a collector of one of the first and second transistors; a current control circuit comprising a current mirror circuit having third and fourth transistors, the third transistor being operatively coupled between an output of the output transistor and the second potential power supply line, the fourth transistor being operatively coupled to the second potential power supply line, and controlling a current flowing through the output to carry out a level conversion of the input signal in producing a signal at the output the level converted signal functioning as a CMOS level control signal; a switch circuit, operatively coupled between the first potential power supply line and the fourth transistor, responsive to a control signal and controlling a supply of a current or a break thereof from the output transistor to the third transistor; and a drive unit, operatively coupled between the first and second potential power supply lines, responsive to the control signal and thus controlling an activation or inactivation of the constant current source.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

For a better understanding of the preferred embodiments of the present invention, the problems in the prior art will be explained with reference to FIG. 1.

Figure 1:
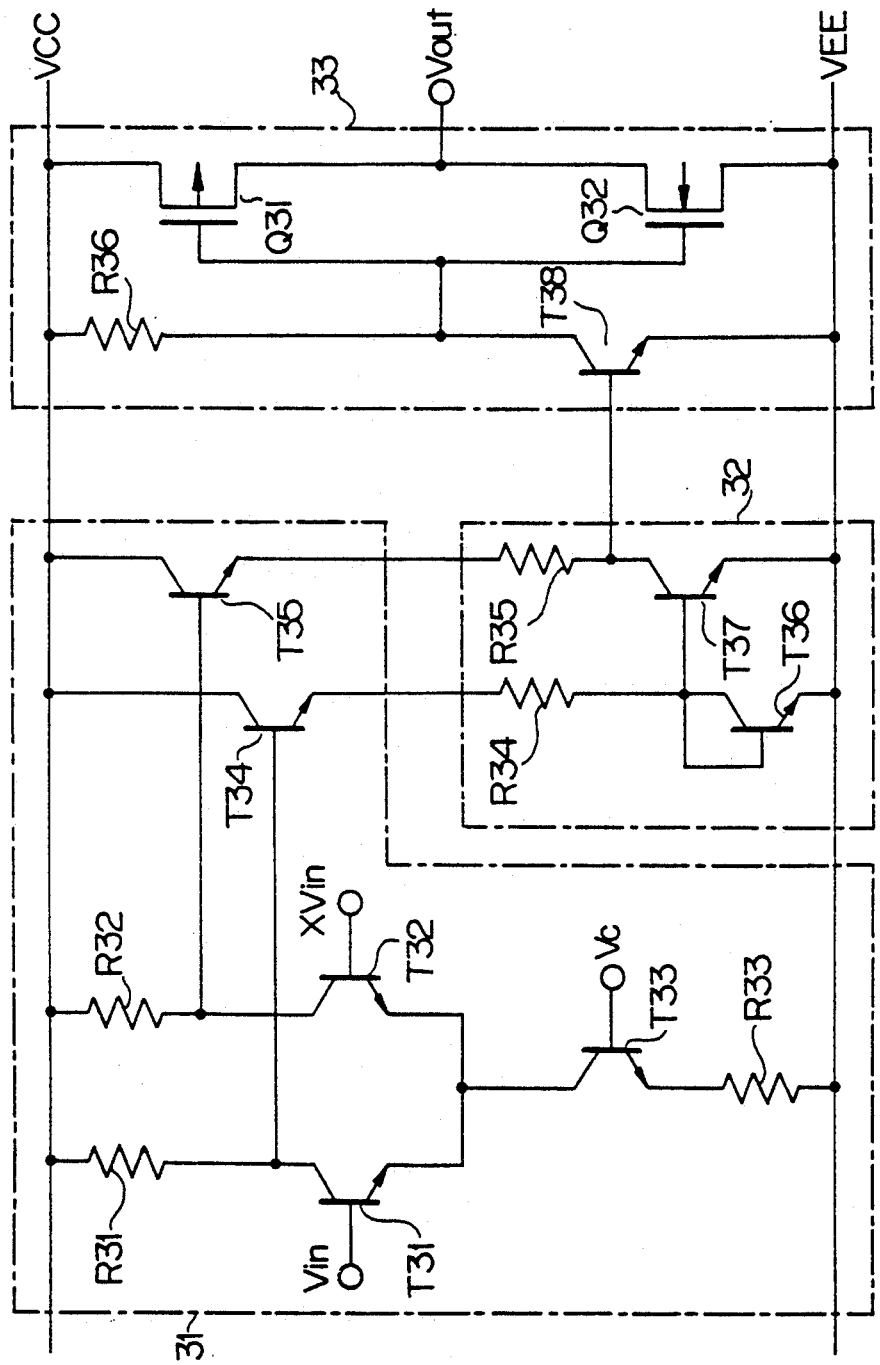
FIG. 1 is a circuit diagram of a prior art level conversion circuit.

FIG. 1 illustrates a prior art level conversion circuit. The illustrated level conversion circuit comprises an ECL logic circuit 31, a current control circuit 32 in the form of a bipolar current mirror circuit, an output stage circuit 33, and a power supply line VCC of a high potential, and a power supply line VEE of a relatively lower potential.

The ECL logic circuit 31 comprises a pair of NPN bipolar transistors T31 and T32 having emitters coupled in common to each other and responsive to complementary signals Vin and XVin of ECL logic level, respectively applied to the bases thereof; a constant current circuit consisting of an NPN bipolar transistor T33, having a collector connected to the coupled emitters of the transistors T31, T32 and responsive to a constant voltage Vc applied to the base thereof, and a resistor R33 connected between the emitter of the transistor T33 and the power supply line VEE; a pair of resistors R31 and R32 connected between the respective collectors of the transistors T31, T32 and the power supply line VCC; an NPN bipolar transistor T34 (emitter follower) having a collector connected to the power supply line VCC and responsive to a signal applied to the base thereof from the collector of the transistor T31; and an NPN bipolar transistor T35 (emitter follower), having a collector connected to the power supply line VCC, and responsive to a signal applied to the base thereof from the collector of the transistor T32.

The current control circuit 32 is a current mirror circuit and comprises a resistor R34 connected to an emitter of the transistor T34; a resistor R35 connected to an emitter of the transistor T35; an NPN bipolar transistor T36 having a collector connected to the resistor R34, an emitter connected to the power supply line VEE, and a base connected to its collector; and an NPN bipolar transistor T37 having a collector connected to the resistor R35, an emitter connected to the power supply line VEE, and a base connected to the collector of the transistor T36.

Also, the output stage circuit 33 comprises an NPN bipolar transistor T38, having an emitter connected to the power supply line VEE, and responsive to a signal from the collector of the transistor T37; a resistor R36 connected between a collector of the transistor T38 and the power supply line VCC; and a CMOS inverter, (P channel MOS transistor Q31 and N channel MOS transistor Q32) connected between the power supply lines VCC and VEE, responsive to a signal from the collector of the transistor T38, and forming an output signal Vout of CMOS logic level.

In the above embodiment, when the input signal Vin of "L" level is input to the base of the transistor T31 and the input signal XVin of "H" level is input to the base of the transistor T32, the transistor T31 is turned OFF and the transistor T32 is turned ON. As a result, all of the current flowing through the resistor R31 from the power supply line VCC is fed to the base of the transistor T34, and pat of the current flowing through the resistor R32 from the power supply line VCC is fed to the base of the transistor T35. Accordingly, the collector current of the transistor T34 becomes more then that of the transistor T35 and thus, in the current control circuit 32, the current fed to the transistor T36 becomes more than that fed to the transistor T37. Therefore, all of the current flowing through the resistor R35 from the transistor T35 is drawn out by the transistor T37. Since no current is fed to the base of the transistor T38 of the output stage circuit 33, the transistor T38 is turned OFF. As a result, the transistor Q32 is turned ON and thus the output signal Vout is brought to "L" level.

On the other hand, when the signal Vin of "H" level is input to the base of the transistor T31 and the signal XVin of "L" level is input to the base of the transistor T32, the transistor T31 is turned ON and the transistor T32 is turned OFF. As a result, the current fed to the base of the transistor T34 becomes less than that fed to the base of the transistor T35 and, accordingly, the collector current of the transistor T34 becomes less than that of the transistor T35. In the current control circuit 32, however, the current mirror functions works and thus, the current flowing through the transistor T37 is controlled to be equal to that flowing through the transistor T36. Therefore, a current corresponding to the difference between the current flowing through the transistor T35 and the current flowing through the transistor T37 is fed to the base of the transistor T38 of the output stage circuit 33 and thus, the transistor T38 is turned ON. As a result, the transistor Q31 is turned ON and thus the output signal Vout is brought to "H" level.

Although the level conversion circuit explained above is excellent in providing high speed operation and low power dissipation, there is still an even greater need to decrease power dissipation of the entire circuit because a current always flows in the current control circuit 32 constituted in the form of a current mirror circuit.

Thus, the above level conversion circuit poses a problem in that, when it is used in an apparatus or system such as a mobile communication apparatus whose stand-by time is relatively long, the current continues to flow in the current control circuit 32 even in the stand-by state and thus the power is wastefully dissipated.

To cope with the disadvantage, an idea that power supply voltages fed to the apparatus are cut off in the stand-by state has been conceived. In this case, however, in CMOS transistors Q31 and Q32 of the output stages circuit 33 are also cut off from the power supply voltages. As a result, when the apparatus is brought to its working state from its stand-by state and thus powered ON, a problem occurs in that the operation of the CMOS transistors is delayed. This is a serious obstacle to high speed operation of the level conversion circuit.

Figure 2:
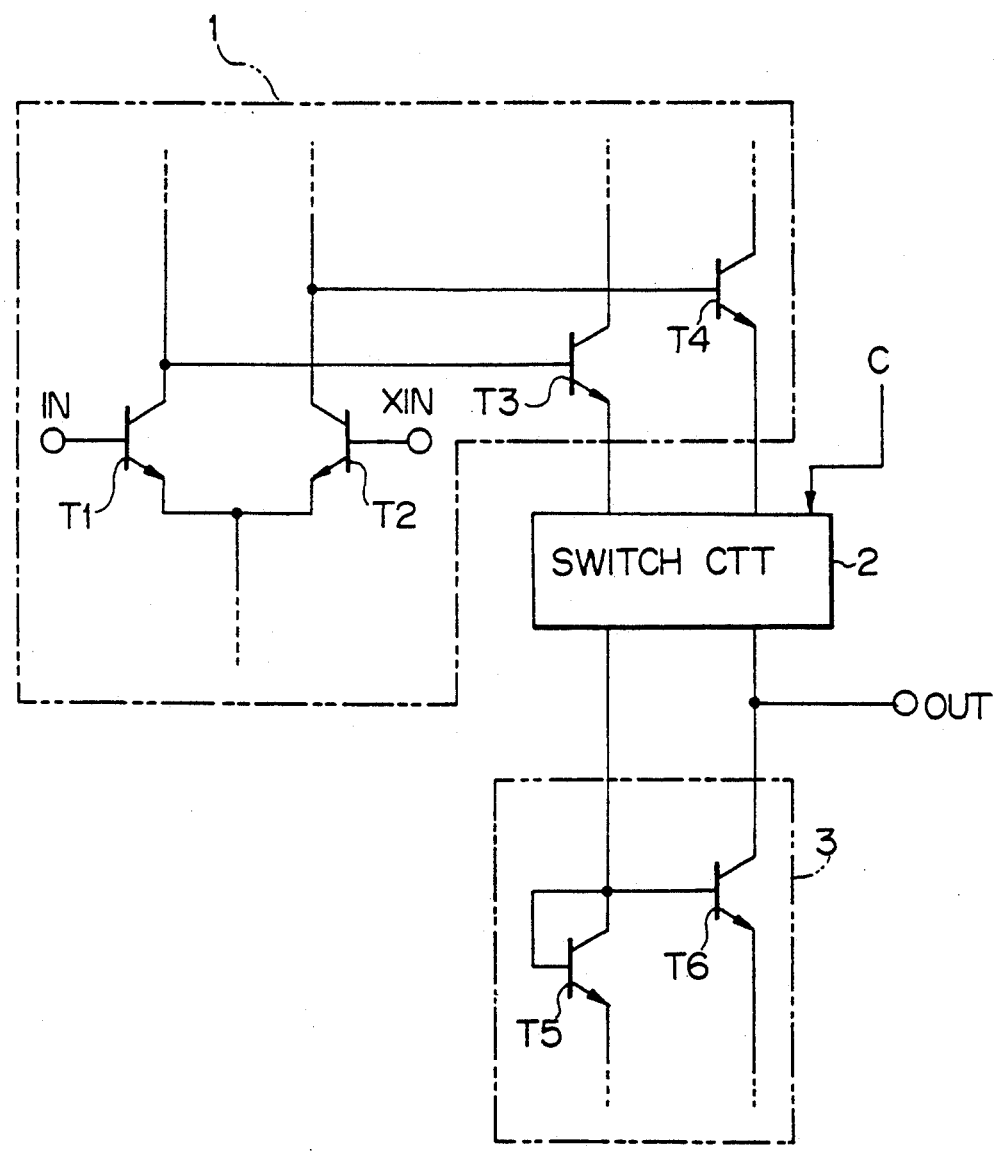
FIG. 2 is a diagram of a fundamental embodiment of the level conversion circuit according to the present invention.

FIG. 2 illustrates a fundamental embodiment of the level conversion circuit according to the present invention.

In the illustration, reference 1 denotes an ECL logic circuit, which comprises a current switch circuit having first and second transistors T1,T2 each having an emitter coupled to each other and receiving (i.e., inputting to the bases of the transistors T1,T2) complementary input signals IN,XIN of ECL logic level, respectively, and a pair of output transistors T3,T4 each coupled to a corresponding collector of the first and second transistors T1,T2.

Also, reference 3 denotes a current control circuit, which comprises a current mirror circuit having third and fourth transistors T5,T6 each coupled to an output of the corresponding output transistors T3,T4, and controls a current flowing through at least one output to thereby carry out a level conversion of a signal at the output.

Reference 2 denotes a switch circuit featuring the present invention. The switch circuit 2 is operatively coupled between the output transistors T3,T4 in the ECL logic circuit 1 and the transistors T5,T6 in the current control circuit 3, responsive to a control signal C, and controls a supply of currents or a break thereof from the output transistors T3,T4 to the third and fourth transistors T5,T6.

In this embodiment, it is first assumed that the switch circuit 2 is activated by the control signal C, i.e., it is in a conductive state.

In this state, when the input signal IN of "H" level is input to the base of the transistor T1 and the input signal XIN of "L" level is input to the base of the transistor T2, the transistor T1 is turned ON and the transistor T2 is turned OFF. As a result, the potentials at each collector of the transistors T1,T2 are brought to "L" level and "H" level, respectively, and thus, the current fed to the base of the output transistor T3 becomes less than that fed to the base of the output transistor T4. Accordingly, the collector current of the transistor T3 becomes less than that of the transistor T4. These collector currents are supplied through the switch circuit 2 to the transistors T5,T6 in the current control circuit 3.

In the current control circuit 3, the current mirror function works and thus, the current flowing through the transistor T6 is controlled to be equal to that flowing through the transistor T5. Therefore, a current corresponding to the difference between the current flowing through the transistor T4 and the current flowing through the transistor T6 flows out from the output terminal OUT.

On the other hand, when the input signal IN of "L" level is input to the base of the transistor T1 and the input signal XIN of "H" level is input to the base of the transistor T2, the transistor T1 is turned OFF and the transistor T2 is turned ON. As a result, the potentials at each collector of the transistors T1,T2 are brought to "H" level and "L" level, respectively, and thus, the current fed to the base of the output transistor T3 becomes more than that fed to the base of the output transistor T4. Accordingly, the collector current of the transistor T3 becomes more than that of the transistor T4. In the like manner, these collector currents are supplied through the switch circuit 2 to the transistors T5,T6.

In the current control circuit 3, since the current fed to the transistor T6 becomes less than that fed to the transistor T5, all of the current fed from the transistor T4 is drawn out by the transistor T6. As a result, no current flows out from the output terminal OUT.

Depending on the logic level of the input signal IN,XIN, it is possible to take two output states from the output terminal OUT. Regardless of the logic level of the input signal IN,XIN, however, some current continues to flow in the current control circuit 3.

In this case, when the switch circuit 2 is inactivated by the control signal C, i.e., it is brought to a non-conductive state, no current flows into the current control circuit 3. Therefore, by bringing the switch circuit 2 to the non-conductive state when an apparatus or system to which the present level conversion circuit is applied lies in its stand-by state, it is possible to decrease the power dissipation without hindering high speed operation.

Next, the preferred embodiments of the present invention will be explained with reference to FIGS. 3 to 5.

Figure 3:
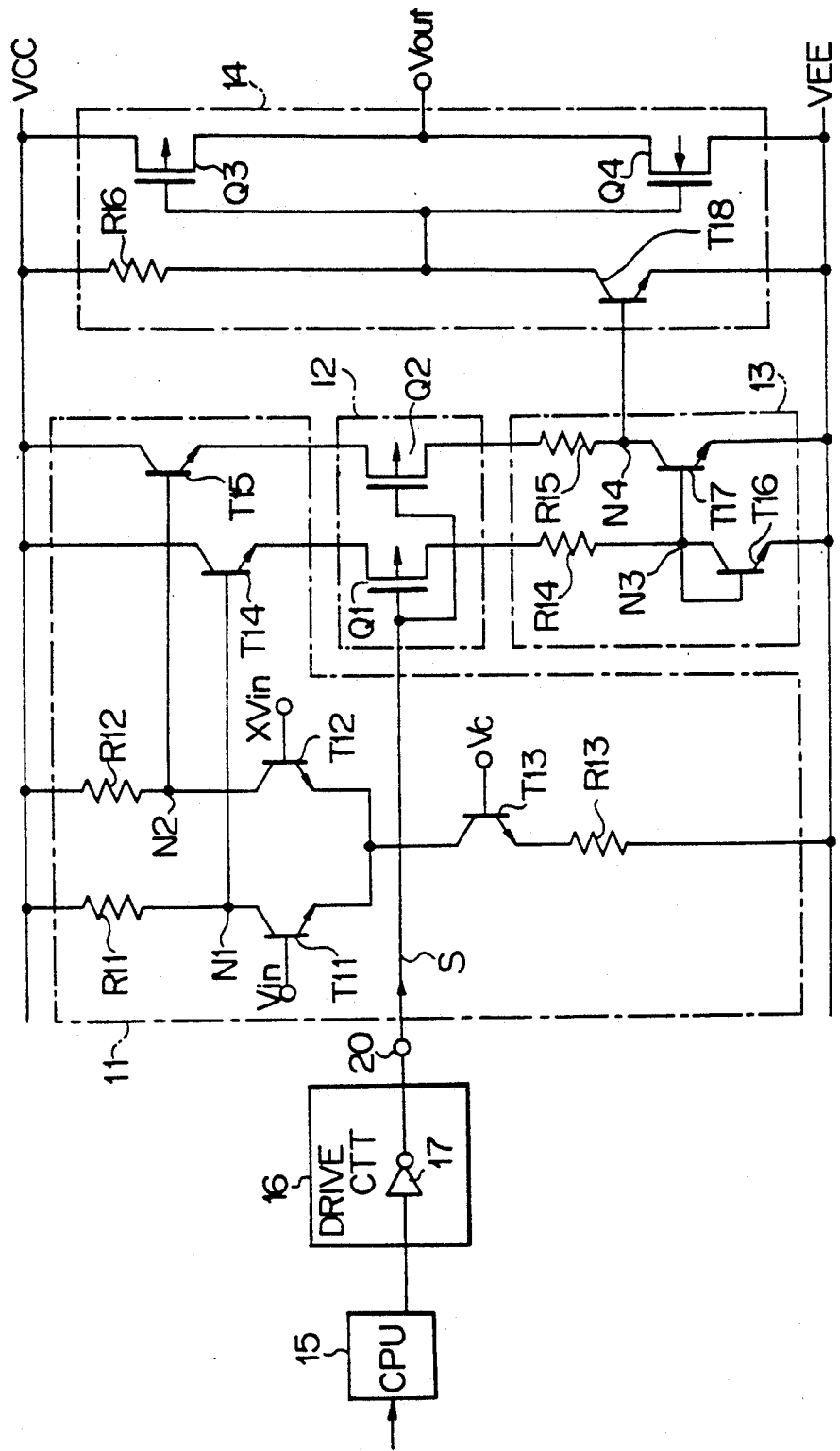
FIG. 3 is a circuit diagram of a level conversion circuit in accordance with a first embodiment of the present invention.

FIG. 3 illustrates a first embodiment of the level conversion circuit, which is employed in a mobile communication telephone set.

The level conversion circuit of this embodiment comprises by an ECL logic circuit 11, a switch circuit 12, a current control circuit 13 and an output stage circuit 14.

The ECL logic circuit 11 comprises a pair of NPN bipolar transistors T11 and T12 having emitters coupled to each other and responsive to complementary signals Vin and XVin of ECL logic level, respective applied to the bases thereof; a constant current circuit consisting of an NPN bipolar transistor T13 having a collector connected to the coupled emitters of the transistors T11,T12 and responsive to a constant voltage Vd applied to the bases thereof, and a resistor R13 connected between emitter of the transistor T13 and a low potential power supply line VEE; a pair of resistors R11 and R12 connected between each collector of the transistors T11, T12 and a relatively high potential power supply line VCC; an NPN bipolar transistor T14 having a collector connected to the power supply line VCC and responsive to a signal from the collector (node N1) of the transistor T11; and an NPN bipolar transistor T15 having a collector connected to the power supply line VCC and responsive to a signal applied to the base thereof from the collector (node N2) of the transistor T12.

The switch circuit 12 comprises a pair of P channel MOS transistors Q1 and Q2, each having a gate connected to a control signal terminal 20 and source connected to an emitter of the corresponding transistor T14, T15.

Also, the current control circuit 13 comprises a current mirror circuit which further comprises: a resistor R14 having one end connected to a drain of the resistor Q1; a resistor R15 having one end connected to a drain of the transistor Q2; an NPN bipolar transistor T16 having a collector (node N3) connected to another end of the resistor R14, an emitter connected to the power supply line VEE, and a base connected to its collector; and an NPN bipolar transistor T17 having a collector (node N4) connected to another end of the resistor R15, an emitter connected to the power supply line VEE, and a base connected to the collector (node N3) of the transistor T16.

The output stage circuit 14 comprises an NPN bipolar transistor T18 having an emitter connected to the power supply line VEE and responsive to a signal applied to the base thereof from the collector (node N4) of the transistor T17; a resistor R16 connected between a collector of the transistor T18 and the power supply line VCC; and a CMOS inverter (P channel MOS transistor Q3 and N channel MOS transistor Q4) connected between the power supply lines VCC and VEE, responsive to a signal applied to the gates of transistors Q3,Q4 from the collector of the transistor T18 and forming an output signal Vout of CMOS logic level.

Also, reference 15 denotes a central processing unit (CPU) functioning as a judging circuit, which judges whether an apparatus or system to which the present level conversion circuit is applied lies in its stand-by state or working state. Reference 16 denotes a drive circuit, which drives the level conversion circuit in response to a control signal from the CPU 15. The drive circuit 16 comprises an inverter 17 responsive to the control signal from the CPU 15, of which the output is coupled through the control signal terminal 20 to each gate of the transistors Q1, Q2 in the switch circuit 12.

In the present embodiment, the CPU 15 outputs the control signal of "L" level to the drive circuit 16 when it receives an external signal indicating the stand-by state of the apparatus or system, and it outputs the control signal of "H" level to the drive circuit 16 when the external signal indicates the working state thereof. Also, the CPU 15 outputs the control signal in the form of a pulsed signal and thereby intermittently operates the switch circuit 12. Accordingly, the transistors Q1, Q2 in the switch circuit 12 are intermittently turned ON or OFF.

The external signal indicating the stand-by state is input to the CPU 15, the inverter 17 in the drive circuit 16 inverts the "L" level control signal from the CPU 15 and forms the "H" level control signal to feed it to the respective gates of transistors Q1, 2 in the switch circuit 12. As a result, both the transistors Q1 and Q2 are turned OFF. On the other hand, when the external signal indicating the working state is input to the CPU 15, the inverter 17 inverts the "H" level control signal from the CPU 15 and feeds the "L" level control signal to the respective gates of transistors Q1 and Q2. Thus, the transistors Q1, Q2 are turned ON.

Next, the mode of operation of the level conversion circuit according to the first embodiment will be explained.

First, when a speech start signal (i.e., the external signal indicating the working state of the apparatus) is input to the CPU 15, the CPU 15 outputs the "H" level control signal to the inverter 17 in the drive circuit 16. The inverter 17 inverts the "H" level control signal to "L" level, feeds the "L" level control signal through the control signal terminal 20 to each gate of the transistors Q1, Q2 in the switch circuit 12, and thus turns ON the transistors Q1 and Q2.

In this state, when the input signal Vin of "H" level is input to the base of the transistor T11 (i.e., receives an input signal Vin) in the ECL logic circuit 11 and the input signal XVin of "L" level is input to the base of the transistor T12 (i.e., receives an input signal XVin) therein, the transistor T11 is turned ON and the transistor T12 is turned OFF. As a result, the potentials at nodes N1 and N2 are brought to "L" level and "H" level, respectively, and thus, the current fed to the base of the transistor T14 becomes less than that fed to the base of the transistor T15. Accordingly, the collector current of the transistor T14 becomes less than that of the transistor T15. These collector currents are supplied through the "ON" transistors Q1, Q2 of the switch circuit 12 to the current control circuit 13.

In the current control circuit 13, the current mirror function works and thus, the current flowing through the transistor T17 is controlled to be equal to that flowing through the transistor T16. Therefore, a current corresponding to the difference between the current flowing through the transistor T15 and the current flowing through the transistor T17 is fed to the base of the transistor T18 of the output state circuit 14 and thus, the transistor T18 is turned ON. As a result, the transistor Q3 is turned ON and thus, the output signal Vout is brought to "H" level.

On the other hand, when the input signal Vin of "L" level is input to the base of the transistor T11 in the ECL logic circuit 11 and the input signal XVin of "H" level is input to the base of the transistor T12 therein, the transistor T11 is turned OFF and the transistor T12 is turned ON. As a result, the potentials at nodes N1 and N2 are brought to "H" level and "L" level, respectively. Accordingly, the current fed to the base of the transistor T14 becomes more than that fed to the base of the transistor T15 and thus the collector current of the transistor T14 becomes more than that of the transistor T15. In the like manner, these collector currents are supplied through the "ON" transistors Q1, Q2 to the current control circuit 13.

In the current control circuit 13, since the current fed to the transistor T17 becomes less than that fed to the transistor T16, all of the current flowing through the resistor R15 from the transistor T15 is drawn out by the transistor T17. As a result, no current is fed to the base of the transistor T18 of the output stage circuit 14 and thus, the transistor T18 is turned OFF. Therefore, the transistor Q4 is turned ON and thus, the output signal Vout is brought to "L" level.

Next, when the CPU 15 detects a termination of the speech start signal (i.e., the external signal indicating the stand-by state), it outputs the "L" level control signal to the inverter 17 in the drive circuit 16. The inverter 17 inverts the "L" level control signal to "H" level, feeds the "H" level control signal through the control signal terminal 20 to each gate of the transistors Q1, Q2 in the switch circuit 12, and thus, turns OFF the transistors Q1 and Q2.

As explained above, according to the embodiment of FIG. 3, the current control circuit 13 can be intermittently operated by the switch circuit 12 responsive to the control signal "S". Accordingly, when the switch circuit 12 is inactivated in the stand-by state of the apparatus or system, no current flows into the current control circuit 13, and thus, it is possible to decrease the power dissipation of the entire circuit without hindering high speed operation.

Although, in the above embodiment, the switch circuit 12 is intermittently operated by the drive circuit 16, it can be brought to a perfect "OFF" state in the stand-by state. In this case, it is possible to further decrease the power dissipation compared with the case of the above embodiment.

Also, by a suitable modification of the switch circuit 12, the P channel MOS transistors Q1 and Q1 can be substituted by N channel MOS transistors.

Figure 4:
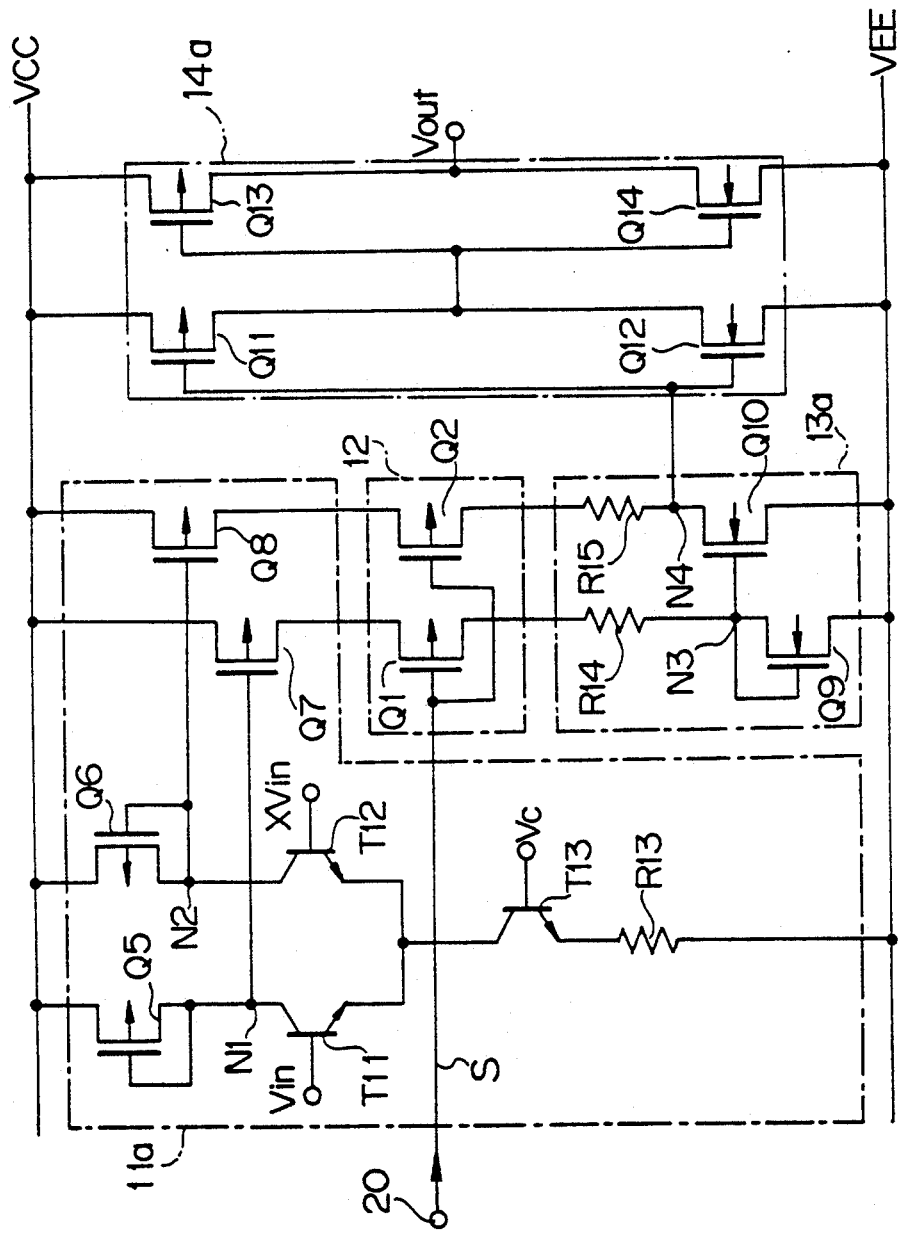
FIG. 4 is a circuit diagram of a level conversion circuit in accordance with a second embodiment.

FIG. 4 illustrates a second embodiment of the level conversion circuit.

In comparison, with the constitution of FIG. 3, referring to the ECL logic circuit 11a (11), the resistors R11 and R12 are substituted by P channel MOS transistors Q5 and Q6, respectively, of which each gate is connected to the respective drain, and the output transistors (NPN bipolar transistors) T14 and T15 are substituted by P channel MOS transistors Q7 and Q8, respectively.

Also, referring to the current control circuit 13a (13), the NPN bipolar transistors T16 is substituted by an N channel MOS transistor Q9 of which the gate is connected to its drain, and the NPN bipolar transistor T17 is substituted by an N channel MOS transistor Q10.

Furthermore, the output stage circuit 14 is substituted by an output stage circuit 14a, which includes a first CMOS inverter (P channel MOS transistor Q11 and N channel MOS transistor Q12) responsive to a signal at node N4, and a second CMOS inverter (P channel MOS transistor Q13 and N channel MOS transistor Q14) responsive to an output signal of the first CMOS inverter and forming an output signal Vout of CMOS logic level.

The mode of operation of the level conversion circuit according to the second embodiment is easily deduced from that of the first embodiment, and thus, the explanation thereof is omitted.

Figure 5:
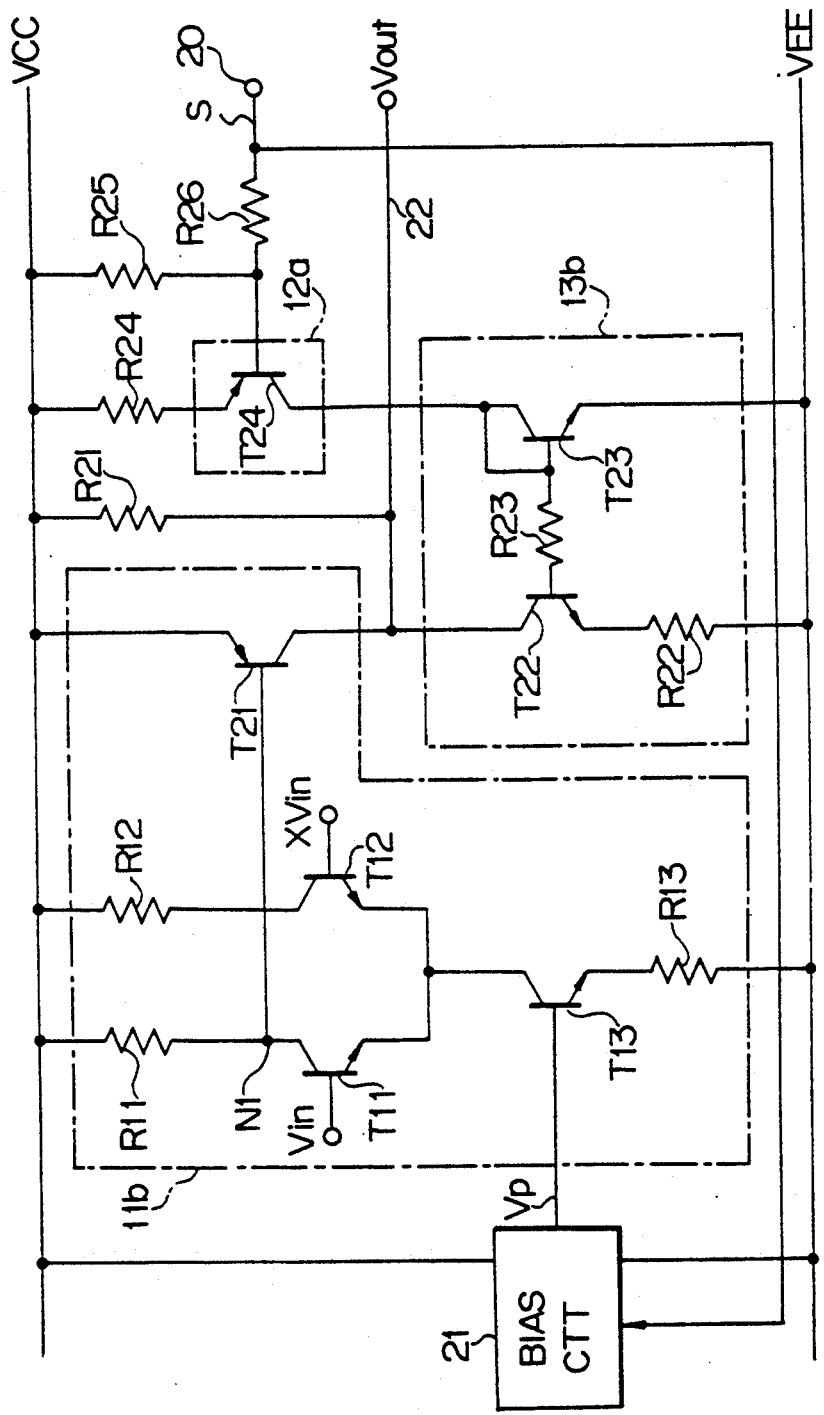
FIG. 5 is a circuit diagram of a level conversion circuit in accordance with a third embodiment.

FIG. 5 illustrates a third embodiment of the level conversion circuit. In this illustration, the same references as those used in FIGS. 3 and 4 indicate like constituent elements, and thus, the explanation thereof is omitted.

In comparison with the embodiment of FIG. 3, referring to the ECL logic circuit 11b (11), the output transistors (NPN bipolar transistors) T14 and T15 are substituted by a single PNP biplar transistor (output transistor) T21. An emitter of the transistor T21 is connected to the power supply line VCC, a base thereof is connected to node N1, and collector thereof is connected to an output line 22. Also, in place of the constant voltage Vc, a bias voltage Vp is input to the base of the transistor T13.

Also, the switch circuit 12 is substituted by a switch circuit 12a including a PNP bipolar transistor T24. An emitter of the transistor T24 is connected via a resistor R24 to the power supply line VCC, and a base thereof is connected via a resistor R25 to the power supply line VCC and connected via a resistor R26 to the control signal terminal 20. Furthermore, a resistor R21 is connected between the power supply line VCC and the output line 22.

Also, the current control circuit 13 is substituted by a current control circuit 13b comprising a current mirror circuit. The current control circuit 13b comprises an NPN bipolar transistor T22 having a collector connected to the output line 22; a resistor R22 connected between an emitter of the transistor T22 and the power supply line VEE; an NPN bipolar transistor T23 having a collector connected to a collector of the transistor T24, an emitter connected to the power supply line VEE, and a base connected to its collector; and a resistor R23 connected between each base of the transistors T22 and T23.

Furthermore, there is provided a bias circuit 21 connected between the power supply lines VCC and VEE. The bias circuit 21 responds to the control signal "S" input through the control signal terminal 20 and generates the above bias voltage Vp. The control signal terminal 20 is coupled through the drive circuit 16 to the CPU 15 (not shown in FIG. 5 but see FIG. 3).

In the present embodiment, when the "H" level control signal (i.e., a signal indicating the stand-by state) is input to the control signal terminal 20, the bias circuit 21 generates the bias voltage Vp of "L" level and thus turns OFF the transistor T13. On the other hand, when the "L" level control signal (i.e., a signal indicating the working state) is input to the terminal 20, the bias circuit 21 generates the bias voltage Vp of "H" level and thus turns ON the transistor T13.

Therefore, when a speech start signal as the external signal is input to the CPU 15, the "L" level control signal for terminating the stand-by state is input to the control signal terminal 20. As a result, the transistor T24 in the switch circuit 12a is turned ON to thereby activate the current control circuit 13b. At the same time, the bias circuit 21 turns ON the transistor T13 by means of the bias voltage Vp of "H" level. Accordingly, the ECL logic circuit 11b outputs an output signal according to the operating states of the emitter-coupled transistors T11, T12 and sends out the level converted signal through the output transistor T21 to the output line 22.

Also, when the speech start signal is terminated, the "H" level control signal for entering the stand-by state is input to the control signal terminal 20. As a result, the transistor T24 is turned OFF and, at the same time, the bias circuit 21 turns OFF the transistor T13 by means of the bias voltage Vp of "L" level.

According to the embodiment of FIG. 5, since both the ECL logic circuit 11b and the current control circuit 13b are inactivated in the stand-by state, no current flows in either circuit. Thus, it is possible to heighten the effect of the decrease in the power dissipation, compared with the cases of FIGS. 3 and 4.

Although the present invention has been disclosed and described by way of three embodiments, it is apparent to those skilled in the art that other embodiments and modifications of the present invention are possible without departing from the spirit or essential features thereof.

We claim:

1. A level conversion circuit comprising:
   an ECL logic circuit comprising a current switch circuit having first and second transistors each having an emitter and collector, the first and second transistors having the respective emitters thereof coupled to each other and at least one of the first and second transistors receiving an input signal of ECL logic level, and at least one output transistor coupled to the respective collector of at least one of the first and second transistors and having an output;
   a current control circuit comprising a current mirror circuit having third and fourth transistors, at least one of the third and fourth transistors being coupled to the output of the output transistor, and controlling a current flowing through the output to thereby carry out a level conversion of the input signal in producing, at the output of the output transistor, a CMOS level control signal; and a switch circuit, operatively coupled between the output of the output transistor and the current control circuit and which is responsive to a control signal for controlling a supply of current or a break of the supply of current from the output transistor to the current control circuit.

2. A level conversion circuit as set forth in claim 1, wherein the switch circuit further comprises a control signal input terminal, which receives the control signal and wherein the control signal indicates whether the level conversion circuit is to be operating in a stand-by state or a working state.

3. A level conversion circuit for converting an ECL logic level input signal to a corresponding output signal representative of a CMOS logic level, the level conversion circuit being selectively controlled to one of a working state and a stand-by state and comprising:

an ECL logic circuit comprising a current switch circuit having first and second transistors, each transistor having an emitter and collector and the first and second transistors having the respective emitters thereof coupled to each other and at least one of the first and second transistors receiving an input signal of ECL logic level, and having at least one output transistor coupled to the respective collector of at least one of the first and second transistors, the at least one output transistor having an output;

a current control circuit comprising a current mirror circuit having third and fourth transistors, at least one of the third and fourth transistors being coupled to the output of the output transistor and controlling the level of a current flowing through the output thereof to thereby carry out a level conversion of the input signal in producing, at the output of the output transistor, a CMOS level control signal;

a control unit which determines whether the level conversion circuit is to be operating in a stand-by state or a working state and which produces a corresponding control output signal;

a drive unit connected to the control unit and responsive to the control output signal of the control unit and which generates a corresponding drive control signal, based on the control output signal of the control unit; and a switch circuit, operatively coupled between the output of the output transistor and the current control circuit and responsive to the drive control signal generated by the drive unit and which controls the supply of the current or a break of the supply of the current from the output transistor to the current control circuit in accordance with the drive control signal indicating, respectively and selectively, that the level conversion circuit is to be operating in a working state or in a stand-by state.

4. A level conversion circuit as set forth in claim 3, wherein, when the drive control signal indicates the stand-by state, the switch circuit is deactivated to thereby cut off the current to be fed from the output transistor to the current control circuit, and, when the drive control signal indicates the working state, the switch circuit is activated to thereby cause the current to be fed from the output transistor to the current control circuit.

5. A level conversion circuit as set forth in claim 4, further comprising an output stage circuit which is responsive to the CMOS level control signal from the current control circuit and produces a CMOS logic level output signal.

6. A level conversion circuit as set forth in claim 4, further comprising an output stage circuit comprising a first inverter circuit responsive to the CMOS level control signal from the current control circuit and a second inverter circuit responsive to an inverted CMOS level control signal outputted by the first inverter circuit and forming the CMOS logic level output signal, wherein at least one of the first and second inverter circuits is a CMOS inverter circuit.

7. A level conversion circuit as set forth in claim 5, wherein:

the ECL logic circuit further comprises first and second output transistors each responsive to signals from corresponding collectors of the first and second transistors, respectively; and the switch circuit further comprises a pair of switching transistors each responsive to the drive control signal, and operatively coupled between output of the first output transistor and the third transistor, and between output of the second output transistor and the fourth transistor, respectively, whereby the pair of switching transistors are turned ON or OFF by the drive control signal to thereby control a connection or disconnection between the ECL logic circuit and the current control circuit.

8. A level conversion circuit as set forth in claim 7, wherein each of the switching transistors comprises a MOS transistor.

9. A level conversion circuit as set forth in claim 7, wherein the ECL logic circuit further comprises:

a pair of resistance elements connected between each collector of the first and second transistors and a first potential power supply line; and a constant current source connected between the coupled emitters of the first and second transistors and a second potential power supply line, responsive to a constant voltage and causing constant current to flow through one of the first and second transistors.

10. A level conversion circuit as set forth in claim 9, wherein each of the resistance elements comprises a resistor or a MOS transistor whose gate is connected to its drain, each of the first and second output transistors comprises a bipolar transistor or a MOS transistor, and each of the third and fourth transistors comprises a bipolar transistor or a MOS transistor.

11. A level conversion circuit as set forth in claim 4, wherein:

the ECL logic circuit further comprises a single output transistor operatively coupled between a first potential power supply line and the third transistor, and responsive to a signal from the collector of one of the first and second transistors, and the switch circuit further comprises a single switching transistor operatively coupled between the first potential power supply line and the fourth transistor, and responsive to the control signal, whereby the single switching transistor is turned ON or OFF by the drive control signal to thereby activate or deactivate the current control circuit.

12. A level conversion circuit as set forth in claim 11, wherein the single switching transistor comprises a bipolar transistor.

13. A level conversion circuit as set forth in claim 11, wherein the ECL logic circuit further comprises:

a pair of resistance elements connected between each collector of the first and second transistors and the first potential power supply line; and a constant current source connected between the coupled emitters of the first and second transistors and a second potential power supply line, responsive to a variable voltage, and when the variable voltage is at a predetermined level, causing constant current to flow through one of the first and second transistors.

14. A level conversion circuit as set forth in claim 13, wherein each of the resistance elements comprises a resistor, the single output transistor comprises a bipolar transistor, and each of the third and fourth transistors comprises a bipolar transistor.

15. A level conversion circuit as set forth in claim 13, further comprising a second drive unit operatively connected between the first and second potential power supply lines and responsive to the control signal to thereby generate the variable voltage.

16. A level conversion circuit as set forth in claim 15, wherein, when the drive control signal indicates the stand-by state, the switch circuit is deactivated to thereby cut off the current to be fed from the single output transistor to the current control circuit and, at the same time, the second drive unit deactivates the constant current source in the ECL logic circuit to thereby prohibit the constant current from flowing through one of the first and second transistors.

17. A level conversion circuit as set forth in claim 16, wherein, when the control signal indicates the working state, the switch circuit is activated to thereby cause the current to be fed from the single output transistor to the current control circuit and, at the same time, the second drive unit activates the constant current source in the ECL logic circuit to thereby cause the constant current to flow through one of the first and second transistors.

18. A level conversion circuit for converting an ECL logic level input signal to a corresponding output signal representative of a CMOS logic level and selectively controlled to one of working and stand-by states comprising:

a first potential power supply line;
a second potential power supply line;
an ECL logic circuit comprising a current switch circuit having first and second transistors, each of the transistors being operatively coupled to the first potential power supply line, having an emitter coupled to each other and receiving an input signal of ECL logic level, a constant current source coupled between the first and second transistors and the second potential power supply line, and first and second output transistors each coupled to the first potential power supply line and responsive to a signal from a corresponding collector of the first and second transistors, respectively;

a current control circuit comprising a current mirror circuit having third and fourth transistors each coupled between the second potential power supply line and a corresponding output of the first and second output transistors, respectively, and controlling a current flowing through one of the outputs to thereby carry out a level conversion of the input signal at the one output;

an output stage circuit, operatively coupled between the first and second potential power supply lines, responsive to a CMOS level control signal from the current control circuit and forming a CMOS logic level output signal; and a switch circuit, operatively coupled between the output transistors of the ECL logic circuit and the current controls a supply of current or a break of the supply of current from the first and second output transistors to the third and fourth transistors, respectively in accordance with the control signal indicating, respectively and selectively, that the level conversion circuit is to be operating in a working state or in a stand-by state.

19. A level conversion circuit as set forth in claim 18, further comprising a unit which determines whether the level conversion circuit is to be operating in the stand-by state or the working state, to thereby form the control signal.

20. A level conversion circuit as set forth in claim 19, wherein, when the control signal indicates the stand-by state, the switch circuit is deactivated to thereby cut off the current to be fed from the first and second output transistors to the third and fourth transistors.

21. A level conversion circuit comprising:

a first potential power supply line;
a second potential power supply line;
an ECL logic circuit including a current switch circuit having first and second transistors, each of the transistors being operatively coupled to the first potential power supply line, having an emitter coupled to each other and receiving an input signal of ECL logic level, a constant current source coupled between the first and second transistors and the second potential power supply line, and an output transistor coupled to the first potential power supply line and responsive to a signal from a collector of one of the first and second transistors;

a current control circuit including a current mirror circuit having third and fourth transistors, the third transistor being operatively coupled between an output end of the output transistor and the second potential power supply line, the fourth transistor being operatively coupled to the second potential power supply line, and controlling a current flowing through the output end to thereby carry out a level conversion of a signal at the output end;

a switch circuit, operatively coupled between the output of the output transistor and the third transistor, responsive to a control signal and controlling a supply of a current or a break thereof from the output transistor to the third transistor; and a drive unit, operatively coupled between the first and second potential power supply lines, responsive to the control signal and thus controlling an activation or inactivation of the constant current source.

22. A level conversion circuit as set forth in claim 21, further comprising a unit for judging whether an apparatus or system to which the present level conversion circuit is applied lies in its stand-by state or working state, to thereby form the control signal.

23. A level conversion circuit as set forth in claim 22, wherein, when the control signal indicates the stand-by state, the switch circuit is inactivated to thereby cut off the current to be fed from the output transistor to the third transistor and, at the same time, the drive unit inactivates the constant current source to thereby prohibit the constant current from flowing through one of the first and second transistors.

24. A level conversion circuit as set forth in claim 19, wherein when the control signal indicates the working state, the switch circuit is activated to thereby cause the current to be fed from the first and second output transistors to the third and fourth transistors.

25. A level conversion circuit for converting an ECL logic level input signal to a corresponding output signal representative of a CMOS logic level and selectively controlled to one of first and second states comprising:
an ECL logic circuit comprising first and second input transistors, each having an emitter, a base and a collector wherein the respective emitters of the first and second input transistors are coupled to each other and the respective bases of the first and second input transistors receive respective, complementary input signal of ECL logic level, and first and second output transistors having respective control terminals coupled to the respective collectors of the first and second output transistors and respective outputs through which corresponding output currents flow;
a current mirror circuit comprising third and fourth transistors coupled to the respective outputs of the first and second output transistors and controlling the flow of the corresponding output currents to thereby carry out a level conversion of the input signals in producing, at the respective outputs of the first and second output transistors, a CMOS level control signal; and
a switch circuit coupling the respective outputs of the first and second output transistors of the ECL logic circuit to the third and fourth transistors of the current mirror circuit and selectively operable in the first state to supply, and in the second state to discontinue the supply, of the flow of the corresponding output currents from the first and second output transistors respectively to the third and fourth transistors of the current mirror circuit.

26. The level conversion circuit as set forth in claim 25, further comprising an output stage circuit responsive to the CMOS level control signal from the current mirror circuit and producing a CMOS logic level output signal.

27. The level conversion circuit as set forth in claim 25, further comprising an output stage circuit comprising a first inverter circuit responsive to the CMOS level control signal from the current mirror circuit and the second inverter circuit responsive to an inverted CMOS level control signal outputted from the first inverter circuit and forming a CMOS logic level output signal, wherein at least one of the first and second inverter circuits is in the form of a CMOS structure.

28. A level conversion circuit for converting an ECL logic level input signal to a corresponding output signal representative of a CMOS logic level and selectively controlled to one of a first and second states comprising:
an ECL logic circuit comprising first and second transistors, the first and second transistors each having an emitter, a base and a collector, wherein the emitters thereof are coupled to each other and wherein the first and second transistors receive complementary input signal of ECL logic level, and an output transistor having a control terminal and output wherein the control terminal thereof is coupled to one of the collectors of the first and second transistors;
the current mirror circuit comprising third and fourth transistors, each having a control terminal and output wherein the third transistor is coupled to the output of the output transistor, and controlling current flowing through the output to thereby carry out a level conversion of the input signal at the output of the output transistor to form a CMOS logic level output signal; and
a switch circuit comprising a switch transistor having first, second and control terminals, wherein the first and second terminals are coupled to the output transistor and the fourth transistor of the current mirror circuit respectively, and the switch transistor selectively operable in the first state to supply, and in the second state to discontinue the supply, of the flow of current from the output of the output transistor to the current mirror circuit.

* * * * *

UNITED STATES PATENT AND TRADEMARK OFFICE
CERTIFICATE OF CORRECTION

PATENT NO. : 5,287,019

DATED : February 15, 1994

INVENTOR(S) : Nonaka et al.

It is certified that error appears in the above-indentified patent and that said Letters Patent is hereby corrected as shown below:

Col. 1, line 15, after "Bi-CMOS" insert --circuits--.

Col. 3, line 2, after "circuit," insert --being--;

line 4, before "responsive' insert --being--;

line 6, after "unit," insert --being--;

line 8, after "lines," insert --being--;

line 38, after "circuit," insert --and--;

line 39, delete "and".

Col. 4, line 61, change "constituted in the form of" to --comprising--.

Col. 7, line 41, change "The" to --When--.

Signed and Sealed this

Ninth Day of August, 1994

Attest:

BRUCE LEHMAN

*Attesting Officer*  *Commissioner of Patents and Trademarks*